United States Patent
Nakatake et al.

(10) Patent No.: US 7,698,663 B2
(45) Date of Patent: Apr. 13, 2010

(54) APPARATUS, METHOD AND PROGRAM FOR DESIGNING INTEGRATED CIRCUIT

(75) Inventors: Shigetoshi Nakatake, 16-37-1106, Ootemachi, Kokurakita-ku, Kitakyushu, Fukuoka (JP) 8030814; Nobuto Ono, Kitakyushu (JP)

(73) Assignees: Shigetoshi Nakatake, Kitakyushu-shi (JP); Jedat Innovation Inc., Kitakyushu-shi (JP)

( * ) Notice: Subject to any disclaimer, the term of this patent is extended or adjusted under 35 U.S.C. 154(b) by 562 days.

(21) Appl. No.: 11/703,700

(22) Filed: Feb. 8, 2007

(65) Prior Publication Data
US 2008/0134105 A1 Jun. 5, 2008

(30) Foreign Application Priority Data
Nov. 30, 2006 (JP) .............................. 2006-324227

(51) Int. Cl.
*G06F 17/50* (2006.01)
(52) U.S. Cl. .................... 716/1; 716/2; 716/5; 716/11; 716/12
(58) Field of Classification Search ................ 716/1–2, 716/5, 9–12
See application file for complete search history.

(56) References Cited

U.S. PATENT DOCUMENTS 6,557,159 B1 * 4/2003 Kutzschebauch et al. ..... 716/18

2002/0144227 A1 * 10/2002 Das et al. ...................... 716/12

FOREIGN PATENT DOCUMENTS

| JP | 2004-234450 A | 8/2004 |
| JP | 2005-62943 A | 3/2005 |
| JP | 2005-267291 A | 9/2005 |

OTHER PUBLICATIONS

Shigetoshi Nakatake; "Structured Placement with Topological Regularity Evaluation", Department of Information and Media Sciences, University of Kitakyushu, ASP-DAC 2007 12 Asia and South Pacific Design Automation Conference Jan. 23-26, 2007.

* cited by examiner

*Primary Examiner*—Paul Dinh
(74) *Attorney, Agent, or Firm*—Westerman, Hattori, Daniels & Adrian, LLP (57) ABSTRACT

In a preferred embodiment, a CPU extracts a regular structure in a layout of an integrated circuit using layout graphic information, net list information, and constraint information with reference to regularity information of an array-structure, a row-structure, and the like, stored in a magnetic disk storage to evaluate the regular structure, and optimizes the layout of the integrated circuit using the layout graphic information, the net list information, etc., in consideration of the evaluation of the regular structure. Thus, a layout excellent in circuit characteristics and device matching properties, wiring characteristics can be obtained.

8 Claims, 6 Drawing Sheets

FIG. 14

APPARATUS, METHOD AND PROGRAM FOR DESIGNING INTEGRATED CIRCUIT

This application claims priority under 35 U.S.C. §119 to Japanese Patent Application No. 2006-324227 filed on Nov. 30, 2006, the entire disclosure of which is incorporated herein by reference in its entirety.

BACKGROUND OF THE INVENTION

1. Field of the Invention

The present invention relates to, inter alia, an apparatus, a method and a program for working out a layout design of circuit elements in an integrated circuit.

2. Description of the Related Art

The following description sets forth the inventors' knowledge of related art and problems therein and should not be construed as an admission of knowledge in the prior art.

In semiconductor integrated circuits, such as, e.g., LSI (Large Scale Integrated) circuits, in order to work out a layout design of graphic data corresponding to circuit elements, an integrated circuit design apparatus has been conventionally used (see, e.g., JP2004-234450, A, JP2005-062943, A, and JP2005-267291, A).

In a conventional layout technique, within an integrated circuit design apparatus, the layout is designed so that the area and the wire length of the semiconductor circuit become minimum respectively In addition to the above, by adding further constraints, such as, pair nature, symmetry nature, or side alignment nature of circuit elements, it is configured that a layout the same as or similar to a layout designed by analog designers is automatically designed.

With this, a more regularly arranged layout is obtained, resulting in a layout result having better circuit characteristics, better device matching properties and better wiring nature, e.g., easy-to-wire.

In a conventional layout technique, however, as to circuit elements with no additional constraint, a regular placement is not always guaranteed. If constraints are given to all of the circuit elements to ensure the regular placement, there is a problem that constraint contradiction occurs and/or constraint adding steps become extremely complicated. Another problem is a difficulty in adding constraints for regularly arranging all of the circuit elements. Especially, these problems can be dominantly found in designing analog integrated circuits various in circuit element size.

Under the circumstances, in the layout automatically created by a conventional semiconductor integrated circuit design apparatus, there are such problems that favorable circuit characteristics cannot be obtained, favorable wiring cannot be easily created, or the obtained layout is not accepted by layout designers.

The description herein of advantages and disadvantages of various features, embodiments, methods, and apparatus disclosed in other publications is in no way intended to limit the present invention. For example, certain features of the preferred embodiments of the invention may be capable of overcoming certain disadvantages and/or providing certain advantages, such as, e.g., disadvantages and/or advantages discussed herein, while retaining some or all of the features, embodiments, methods, and apparatus disclosed therein.

SUMMARY OF THE INVENTION

The preferred embodiments of the present invention have been developed in view of the above-mentioned and/or other problems in the related art. The preferred embodiments of the present invention can significantly improve upon existing methods and/or apparatuses.

Among other potential advantages, some embodiments can provide an integrated circuit design apparatus capable of obtaining a circuit element layout excellent in circuit characteristics and device matching properties, wiring nature by obtaining a more regularly arranged layout.

Among other potential advantages, some embodiments can provide an integral circuit design program preferably used in structuring the integrated circuit design apparatus.

Among other potential advantages, some embodiments can provide an integral circuit design method preferably used in structuring the integrated circuit design apparatus.

According to a first aspect of a preferred embodiment of the present invention, an integrated circuit design apparatus comprises:

a storing unit configured to store design information required for designing an integrated circuit;

an evaluation unit configured to extract a regular structure in a layout to evaluate regularity of the layout; and an optimization unit configured to optimize the layout of the integrated circuit based on the design information, wherein the optimization unit optimizes the layout of the integrated circuit in consideration of the evaluation of the regularity of the layout by the evaluation unit.

In some examples, it can be configured that the evaluation unit performs an evaluation of regularity of the layout by extracting regular structures in the layout and the optimization unit optimizes the layout of the integrated circuit in consideration of the evaluation of the regularity by the evaluation unit.

In some examples, it can be configured that the design information includes regularity information representing the regular structure, layout graphic information, net list information, constraint information and cost information, the evaluation unit extracts the regular structure to evaluate the regularity by using the layout graphic information, the net list information and the constraint information with reference to the regularity information, and the optimization unit optimizes the layout of the integrated circuit using the layout graphic information, the net list information, and the cost information while satisfying constraint contained in the constraint information and considering the regularity evaluation by the evaluation unit.

In some examples, the evaluation unit can perform an evaluation of the regularity based on topological regular structure and physical regular structure.

In some examples, it can be configured that the regular structures include at least one of an array-structure, a row-structure, a slice-structure, a room-structure, an object-structure, and the evaluation unit performs the evaluation based on at least one of the regular structures when performing an evaluation of the regularity based on topological regular structures.

In some examples, it can be configured that the evaluation unit performs the evaluation based on the local compactness value and the local uniformity value when performing an evaluation of the regularity based on physical regular structures.

According to a second aspect of a preferred embodiment of the present invention, a computer program product having a computer readable medium having computer program logic recorded thereon for optimizing a layout of an integrated circuit comprises:

evaluation means for evaluating regularity of the layout by extracting regular structures in the layout; and optimization means for optimizing the layout of the integrated circuit based on design information required for designing the integrated circuit stored in storing means, wherein the optimization means optimizes the layout of the integrated circuit in consideration of the evaluation of the regularity by the evaluation means.

By executing the computer program, the computer implements the evaluation means for evaluating regularity of the layout by extracting regular structures in the layout and the optimization means for optimizing the layout of the integrated circuit based on design information required for designing the integrated circuit stored in storing means, and the optimization means optimizes the layout of the integrated circuit in consideration of the evaluation of the regularity by the evaluation means.

In some examples, it can be configured that the design information includes regularity information representing the regular structure, layout graphic information, net list information, constraint information and cost information, the evaluation means extracts the regular structure to evaluate the regularity by using the layout graphic information, the net list information and the constraint information with reference to the regularity information, and the optimization means optimizes the layout of the integrated circuit using the layout graphic information, the net list information, and the cost information while satisfying constraints contained in the constraint information and considering the evaluation of the regularity by the evaluation unit.

In some examples, it can be configured that the evaluation means performs an evaluation of the regularity based on topological regular structures and physical regular structures.

In some examples, it can be configured that the regular structure includes at least one of an array-structure, a row-structure, a slice-structure, a room-structure, and an object-structure, and that the evaluation means performs the evaluation based on at least one regular structures in the regular structure when performing an evaluation of the regularity based on topological regular structures.

In some examples, it can be configured that the evaluation means performs the evaluation based on the local compactness value and the local uniformity value when performing an evaluation of the regularity based on topological regular structures.

According to a third aspect of a preferred embodiment of the present invention, a method of designing an integrated circuit comprises the steps of:

storing design information required for designing an integrated circuit;

evaluating regularity of a layout by extracting a regular structure in the layout; and optimizing the layout of the integrated circuit based on the design information in consideration of an evaluation result of the regularity of the layout.

In some embodiments, it can be configured that the regularity of the layout is evaluated based on topological regular structures and physical regular structures.

In some embodiments, it can be configured that the topological regular structures includes at least one of an array-structure, a row-structure, a slice-structure, a room-structure, and an object-structure.

In some embodiments, it can be configured that the evaluation is performed based on at least one of the regular structures when performing an evaluation of the regularity based on topological regular structures.

In some embodiments, it can be configured that the evaluation is performed based on the local compactness value and the local uniformity value when performing an evaluation of the regularity based on physical regular structures.

According to some preferred embodiments of the present invention, a layout excellent in circuit characteristics and wiring characteristics can be obtained by obtaining a regularly arranged layout. Furthermore, by internally considering the regularity of the layout without explicitly specifying regulations from outside, it becomes possible to obtain a regularly arranged layout with minimum additional constraints, which in turn enables to improve the yield, the matching nature, the wiring nature, etc.

In addition, an integrated circuit design program according to the present invention enables an establishment of the integrated circuit design apparatus using a computer.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments can combine one or more aspect or feature of other embodiments where applicable. The descriptions of aspects, features and/or advantages of particular embodiments should not be construed as limiting other embodiments or the claims.

BRIEF DESCRIPTION OF THE DRAWINGS

The preferred embodiments of the present invention are shown by way of example, and not limitation, in the accompanying figures, in which.

DETAILED DESCRIPTION OF THE PREFERRED EMBODIMENTS

In the following paragraphs, some preferred embodiments of the invention will be described by way of example and not limitation. It should be understood based on this disclosure that various other modifications can be made by those in the art based on these illustrated embodiments.

Figure 1:
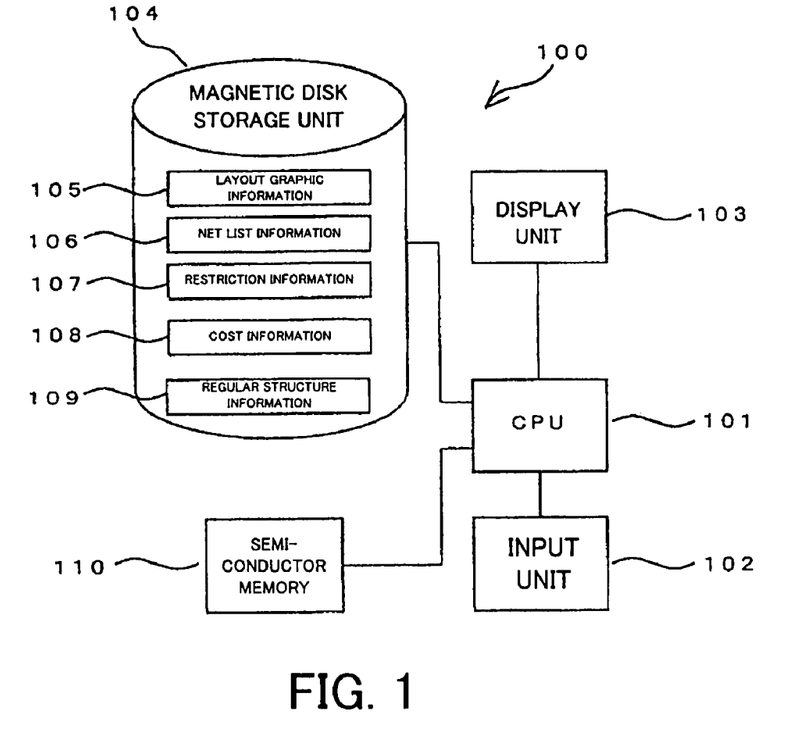
FIG. 1 is a block diagram of an integrated circuit design apparatus according to an embodiment of the present invention.

FIG. 1 is a block diagram of an integrated circuit design apparatus according to an embodiment of the present invention. In FIG. 1, this integrated circuit design apparatus 100 is provided with a central processing unit (CPU) 101, an input unit 102 constituted by, e.g., a keyboard and a mouse, a display unit 103 constituted by, e.g., a liquid crystal display, a magnetic disk storage unit 104 constituting an external storage device, and a semiconductor memory 110 constituting a main storage device or the like.

The magnetic disk storage unit 104 includes layout graphic information storage 105 that stores plural types of information (layout graphic information) on configurations of circuit elements, such as, e.g., devices (circuit elements) or cells which are sets of the devices, constituting a semiconductor integrated circuit and corresponding names of the configurations, net list information storage 106 that stores net list information (wire connection information), constraint information storage 107 that stores constraint information which is information on constraints, e.g., definitions of circuit elements of clusters, etc., constituted by a plurality of devices or cells, or the positional relationship of each circuit element, cost information storage 108 that stores information (cost information) on cost evaluation items, and regular structure information storage 109 that stores information (regular structure information) on regular structures for evaluating layout regularity.

The layout graphic information includes information on configuration (frame) of an instance (a single circuit element unit constituted by single or plural circuit elements (e.g., cells or devices), which is also called block) constituting a net list.

The constraint information is information (constraints) representing conditions which should be always met at the time of doing a layout of circuit elements. The constraint information includes information to be met at the time of doing a layout of circuit elements, such as, e.g., information (e.g., cluster, pair, symmetry) defining circuit elements constituted by plural devices and/or cells, or information representing positional relationship constraints (e.g., horizontal positional relationship constraints and/or vertical positional relationship constraints of plural circuit elements) of each circuit element.

The cost information includes information on cost evaluation target items, such as, e.g., an area and a wire length.

The regular structure information includes information on types of instance placement structures that are bases for evaluating layout regularity. In this embodiment, information defining a regular placement structure, such as, e.g., an array-structure or a row-structure, which will be mentioned later, is included.

The layout graphic information, the net list information, the constraint information, the cost information and the regular structure information constitute design information.

The magnetic disk storage unit 104 also stores an integrated circuit design program to be executed by the CPU 101. The CPU 101 implements the program to execute the following processing.

The CPU 101 constitutes an evaluation means configured to extract a layout regular structure from layout topological expressions and evaluate the layout regular structure as a layout optimization index, and also constitutes an optimization means for executing layout optimization. In executing the layout optimization, the optimization means executes optimization of a topological structure while satisfying conditions, e.g., constraints, which should be always met, and executes optimization of physical structure (e.g., area, wire length) while reflecting the optimized topological structure.

The layout graphic information storage 105 constitutes a layout graphic information storing means for storing layout graphic information of circuit elements. The net list information storage 106 constitutes a net list information storing means for storing net list information. The constraint information storage 107 constitutes a constraint information storing means. The cost information storage 108 constitutes a cost information storing means. The regular structure information storage 109 constitutes a regular structure information storing means.

The input unit 102 constitutes an input means, and the display unit 103 constitutes a display means. The magnetic disk storage unit 104 and the semiconductor memory 110 constitute a storing means, respectively.

FIGS. 2 to 7 show examples of regular structures for use in an evaluation of regularity of a layout in the embodiment of the present invention.

The layout regularity denotes a state in which respective instances or plural instance units are laid out under a certain regulation.

For example, examples of the regularities include three kinds of properties with respect to respective instances or plural instance units, i.e., an vertical and/or horizontal alignment property of instance layout (hereinafter referred to as "alignment property"), a rotation direction property of an instance layout (hereinafter referred to as "direction property"), and a symmetry property of an instance layout (hereinafter referred to as "symmetry property").

In view of the characteristics of LSIs, it is preferable to align these instances or specify the placement from the viewpoint of fabrication yield, which enhances matching properties of transistors especially in analog elements. Furthermore, in cases of hard-wiring circuit elements, the wiring properties, e.g., easiness of wiring, can be improved.

In the following embodiments, the aforementioned three elements (i.e., alignment property, direction property, and symmetry property) on regularity are classified into the following regular structures as layout topology to enable an evaluation of layout regularity.

(i) Array

Figure 2:
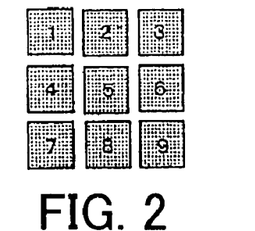
FIG. 2 is an explanatory view showing an example of one of the regular structures according to an embodiment of the present invention.

An image of this structure is shown in FIG. 2 in which a plurality of instances are laid out in a matrix state at the same pitch and at the same intervals in the vertical direction as well as in the horizontal direction. FIG. 2 shows a layout example of an array-structure in which a total of 9 pieces (3×3) of instances 1 to 9 are laid out.

(ii) Row

Figure 3:
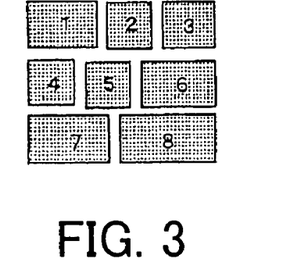
FIG. 3 is an explanatory view showing an example of one of the regular structures according to an embodiment of the present invention.

An image of this structure is shown in FIG. 3 in which plural instances are laid out at the same pitch and at the same intervals in the vertical direction or in the horizontal direction. FIG. 3 shows a layout example of a vertical three-level row-structure in which plural instances 1 to 8 are laid out at the same pitch and at the same intervals in the vertical direction.

(iii) Slice

Figures 4, 5:
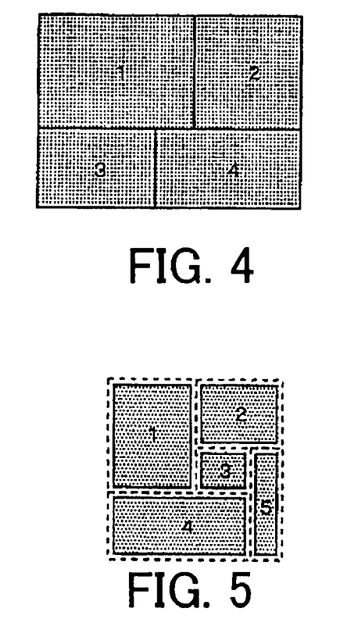
FIG. 4 is an explanatory view showing an example of one of the regular structures according to an embodiment of the present invention.
FIG. 5 is an explanatory view showing an example of one of the regular structures according to an embodiment of the present invention.

An image of this structure is shown in FIG. 4 in which instances can be divided into two groups with a straight line. FIG. 4 shows a layout example of a slice-structure in which the instances can be divided into two groups, i.e., the instances 1 and 2 and the instances 3 and 4, with a horizontal line.

(iv) Room

An image of this structure is shown in FIG. 5 in which a certain area is divided into plural rectangular areas (rooms) as shown by the dashed lines and a single instance is placed in each rectangular area so as not to cause any space in each rectangular area, which includes a concept of the aforementioned slice-structure. FIG. 5 shows a layout example of a room-structure in which a certain area is divided into 5 rectangular areas and a single instance 1 to 5 is placed in each rectangular area.

(v) Object

Figure 6:
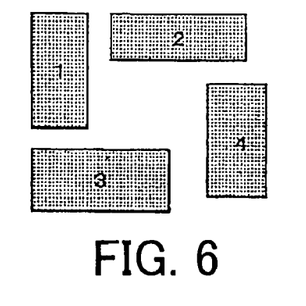
FIG. 6 is an explanatory view showing an example of one of the regular structures according to an embodiment of the present invention.

An image of this structure is shown in FIG. 6 in which each instance 1 to 4 has an arbitrary coordinate after completion of arbitrary compaction.

The aforementioned five types of layout topology (i) to (v) are set so that the priority becomes low from the viewpoint of regularity in the order of array, row, slice, room, and object (array>row>slice>room>object). A previously set evaluation value corresponding to the priority enables numeric conversion of the regularity evaluation.

Figure 7:
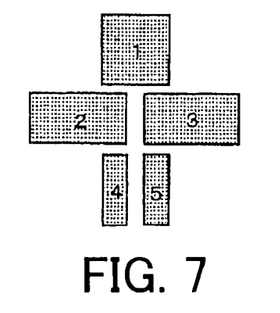
FIG. 7 is an explanatory view showing an example of one of the regular structures according to an embodiment of the present invention.

Other than the above regular structures, as shown in the regular structure "Symmetry" shown in FIG. 7, the structure in which plural instances 1 to 5 are arranged in an axisymmetrical arrangement can be contained.

Figure 8:
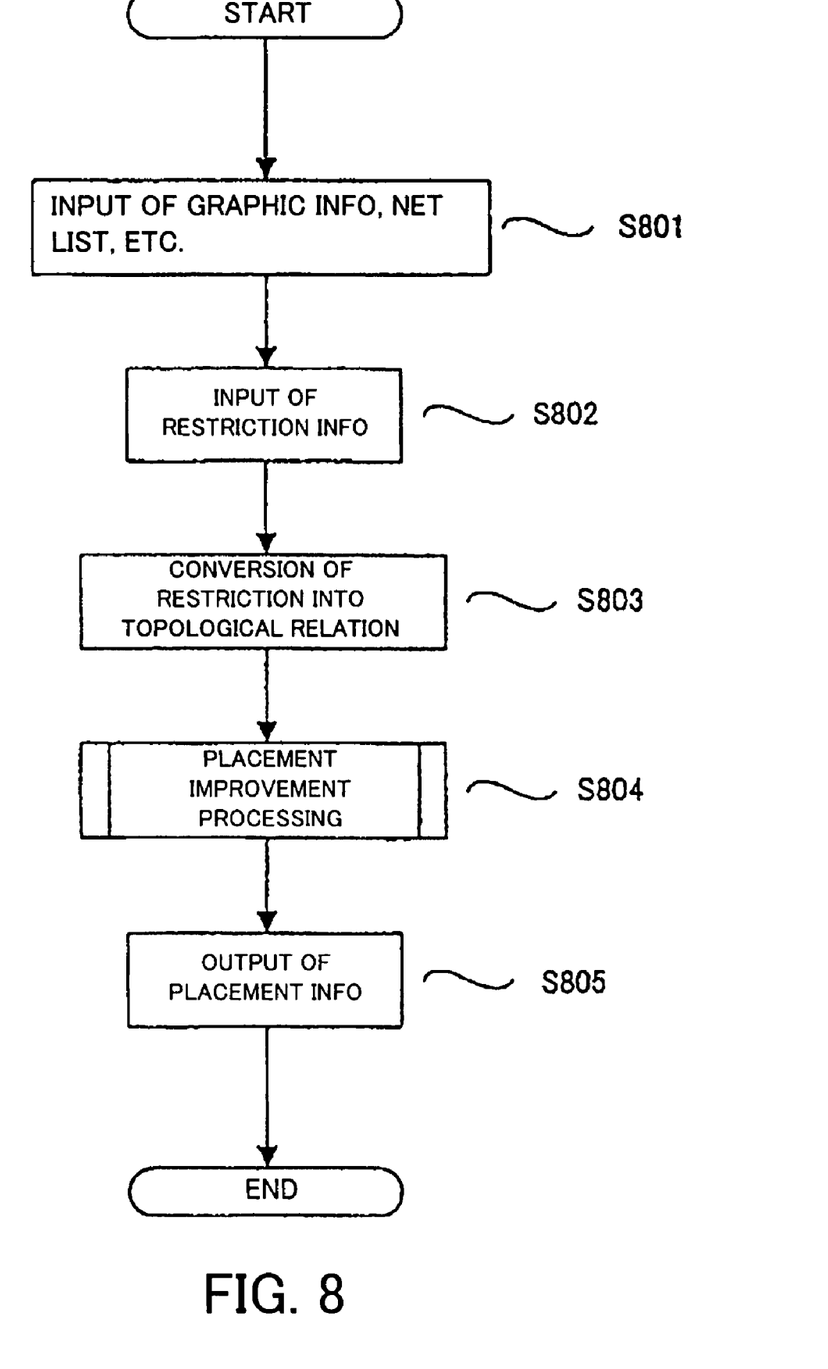
FIG. 8 is a flowchart showing an operation of an integrated circuit design apparatus according to an embodiment of the present invention.
Figure 9:
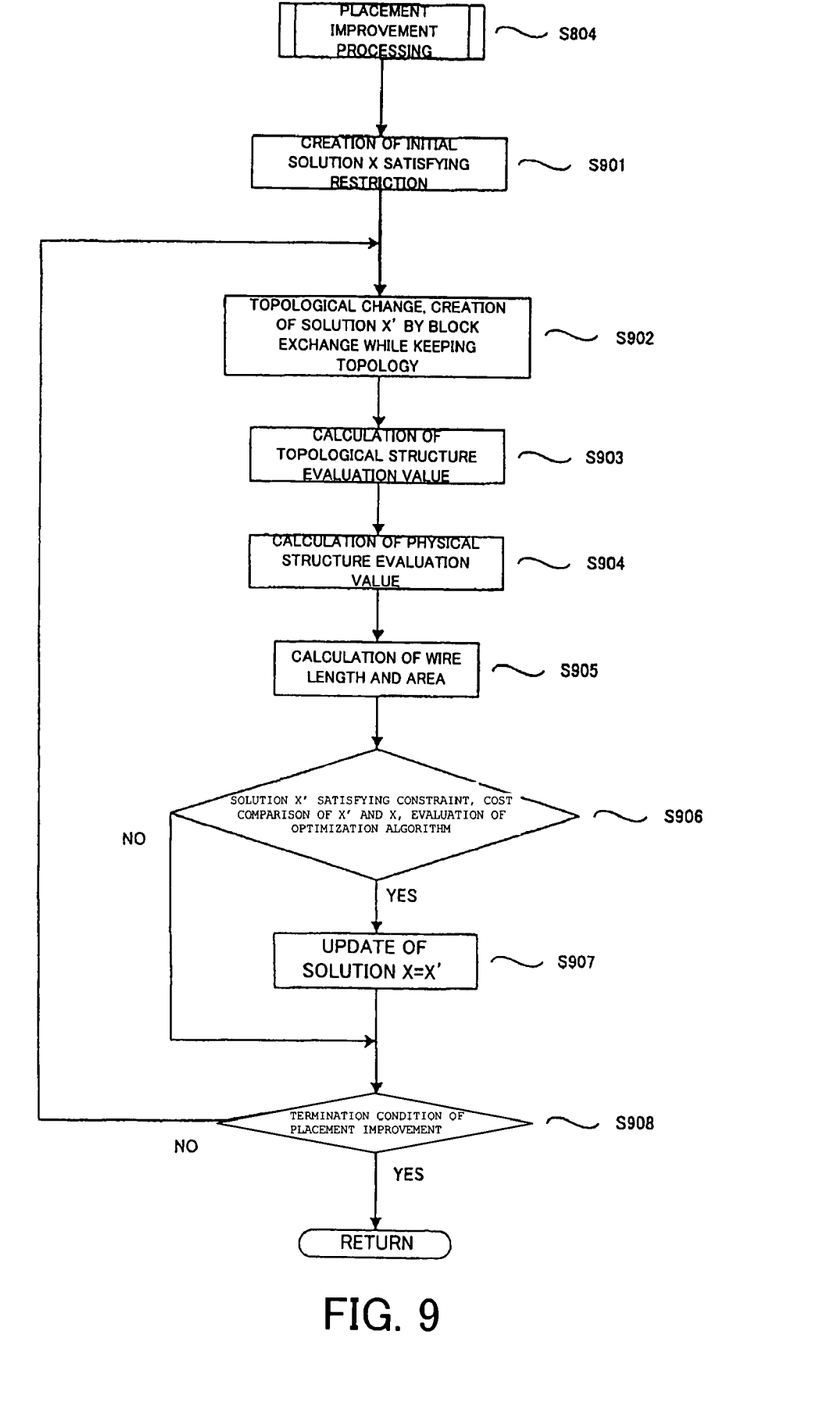
FIG. 9 is a flowchart showing an operation of an integrated circuit design apparatus according to an embodiment of the present invention.

FIGS. 8 and 9 show flowcharts showing the operation of the integrated circuit design apparatus 100 according to an embodiment of the present invention.

Figure 10:
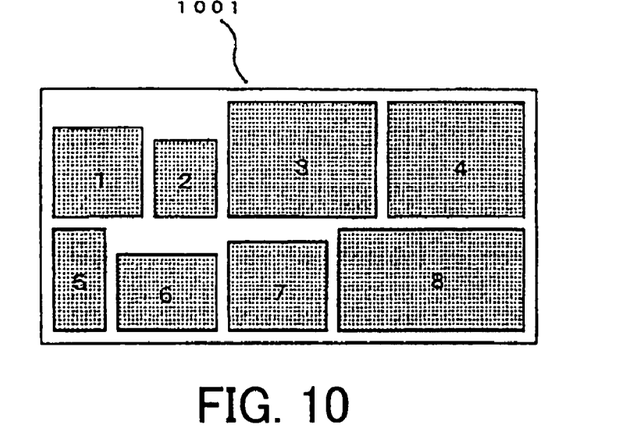
FIG. 10 is an explanatory view showing a local compactness value in an integrated circuit design apparatus according to an embodiment of the present invention.

FIG. 10 is an explanatory view of a local compactness value (an index value of the local compactness status), one of physical structural evaluation values. In FIG. 10, the local compactness value is a cost for improving the compactness rate of the local placement. The local compactness value can be defined as "a total area of the blocks 1 to 8/an area of a minimum rectangular block 1001 surrounding the blocks 1 to 8." As the local compactness value increases, the open area increases, resulting in a higher cost.

Figure 11:
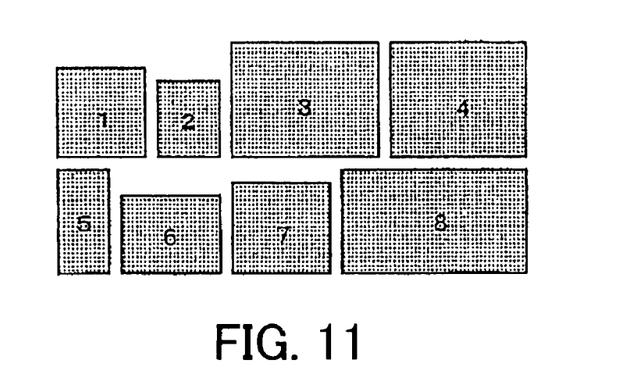
FIG. 11 is an explanatory view showing a local uniformity value in an integrated circuit design apparatus according to an embodiment of the present invention.

FIG. 11 is an explanatory view of a local uniformity value (an index value of uniformity in a row placement) which is one of physical structural evaluation values.

"Row" is a structure in which plural blocks are arranged in a matrix manner. In the case of a horizontal "row," blocks at each stage are the same in height but different in width. The differences between a maximum block width and a minimum block width at each stage are added over all of stages and numerically converted (this converted value is called "local uniformity value") for evaluation. It is discriminated that the smaller the local uniformity value is, the more uniform the row is. In the case of a vertical "row," the local uniformity value is obtained in the same manner to evaluate the uniformity.

For example, in FIG. 11, the local uniformity value is a cost for uniforming the width of blocks of the horizontal row. The local uniformity value is a "(the maximum width–the minimum width of the blocks 1 to 4)+(the maximum width–the minimum width of the blocks 5 to 8)."

Figure 12:
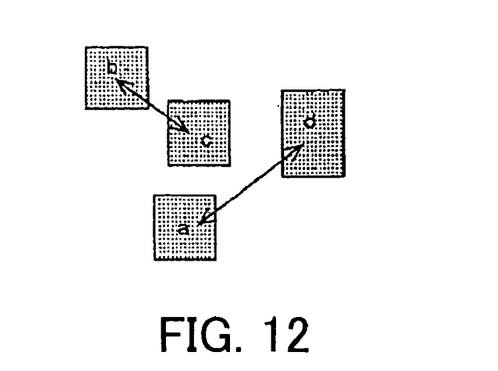
FIG. 12 is an explanatory view showing optimization processing in an integrated circuit design apparatus according to an embodiment of the present invention.
Figure 13:
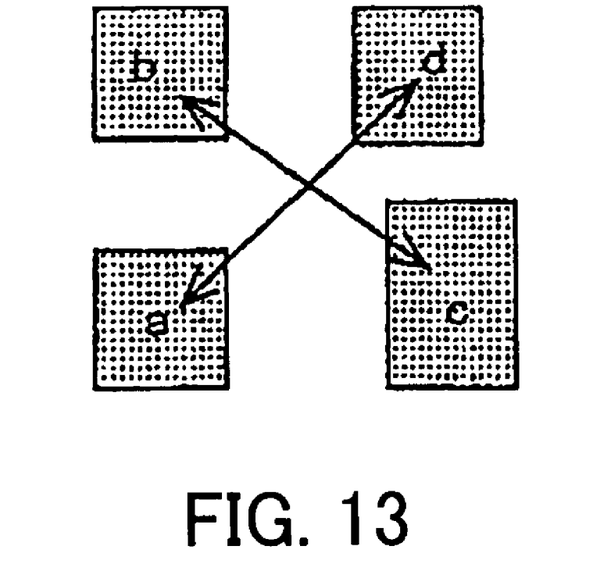
FIG. 13 is an explanatory view showing optimization processing in an integrated circuit design apparatus according to an embodiment of the present invention.
Figure 14:
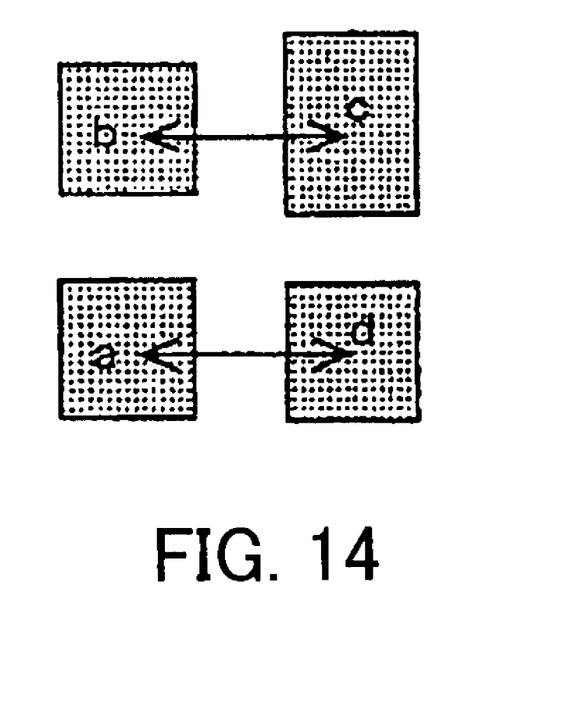
FIG. 14 is an explanatory view showing optimization processing in an integrated circuit design apparatus according to an embodiment of the present invention.

FIGS. 12 to 14 show an example of optimization processing of the integrated circuit design apparatus 100 according to the present invention.

Hereinafter, an integral circuit design apparatus, an integral circuit design program, and an integrated circuit design method according to an embodiment of the present invention will be detailed with reference to FIGS. 1 to 14.

When a user (e.g., a designer of a semiconductor integrated circuit) inputs an initiation instruction of design processing by operating the input unit 102, the CPU 101 reads the integrated circuit design program and the design information stored in the magnetic disk storage unit 104 and executes the integrated circuit design program. Thus, processing in accordance with the input from the input unit 102 becomes ready.

In detail, the CPU 101 reads the layout graphic information from the layout graphic information storage 105, the net list information from the net list information storage 106, the cost information from the cost information storage 108, and the regular structure information from the regular structure information 109 and then inputs them into the memory 110 (Step S801). Here, the net list can be a hierarchical structure.

Furthermore, the CPU 101 reads the constraint information from the constraint information storage 107 and inputs it into the memory 110 (Step S802).

In this embodiment, since evaluation of a regular structure or improvement of a placement are performed using a sequence-pair method, after converting constraints of the constraint information into a topological relation (Step S803), the CPU 101 executes placement improvement processing to optimize the layout so as to satisfy the constraints using the layout graphic information, the net list information and the constraint information with reference to the regularity information (Step S804).

In the placement improvement processing at the processing step S804, the processing shown in FIG. 9 will be executed. That is, the CPU 101 initially creates an initial solution (layout model) satisfying constraints inputted at the processing step S802 (Step S901 in FIG. 9). The initial solution X is an arbitrary solution satisfying the constraints.

Next, with respect to the solution X obtained at the processing step S901, the CPU 101 creates a new solution X' (layout model) by performing block exchanges while performing topological changes or holding the topology (Step S902).

Here, "topological" means to express the relationship of any layout pair by the positional relationship (topological relationship) of the "up-and-down relationship" or the "right-and-left relationship." The block positional relationship of the entire layout is not expressed physically but expressed topologically.

As to the expression method, there are several known methods, such as, e.g., a BSG method (Bounded-Sliceline Grid method), a Sequence-Pair method, an O-Tree method, a B*-Tree method, and a TCG-S method. In this embodiment, algorithm in a sequence-pair method will be explained.

Next, with respect to the solution X', the CPU 101 calculates a topological structural evaluation value by extracting the regularity of the layout from the topological expression (Step S903).

Hereinafter, a method for extracting an array-structure, a row-structure and a symmetry-structure by using a sequence-pair method will be exemplified. In the sequence-pair method, in the case of considering the order of taking out a block in the left upper direction without contacting other blocks in a block layout, this order will be referred to as a "left upper row." In the same manner, the order of taking out a block in the left lower direction will be referred to as a "left lower row." The pair of the left upper row and the left lower row corresponds to a sequence pair. When the block names of the left upper row are replaced with continuous ascending numbers, e.g., 1, 2, 3, . . . , the corresponding left lower row corresponds to a single-sequence.

Initially, in the case of extracting array and row layout topological structures (topological structures), attention is given to a certain block layout or a partial layout. If element numbers are continuously arranged in ascending order (hereinafter referred to as "continuous ascending order") in accordance with the single sequence expression, it is discriminated that the layout corresponds to horizontal single row layout topology (hereinafter referred to as "horizontal single row layout"). On the other hand, if element numbers are continuously arranged in descending order (hereinafter referred to as "continuous descending order"), it is discriminated that the layout corresponds to vertical single layout topology (hereinafter referred to as "vertical single row layout").

Furthermore, these horizontal single row layouts are replaced with one block respectively. In the layout, in the same procedures mentioned above, when a row arranged in continuous descending order is extracted, it is discriminated that the layout corresponds to multistage row layout topology in which horizontal rows are stacked into multiple stages.

In the same manner, when all of the vertical single layouts are replaced with one block respectively and a row arranged in continuous ascending order is extracted, it is discriminated that the layout corresponds to multistage row layout topology in which vertical rows are stacked into multiple stages.

All of the aforementioned procedures can be performed by executing the number of processing corresponding to the number of blocks.

As a special case, when each of the stacked horizontal single layouts has the same number of blocks, it is discriminated that it corresponds to array layout topology. In the same manner, when each of the stacked vertical single layouts has the same number of blocks, it is discriminated that it corresponds to array layout topology.

Furthermore, in the case of extracting symmetry topology, attention is given to a certain block layout or a partial symmetry layout. When a single sequence extracted from the layout and a single sequence extracted from a layout obtained by reversing the layout about a Y-axis in the horizontal direction are the same, it is discriminated that the layout has perfect horizontal symmetrical topology. In the same manner, when a single sequence extracted from the block layout and a single sequence extracted from a layout obtained by reversing the layout about an X-axis in the vertical direction are the same, it is discriminated that the layout has perfect vertical symmetrical topology.

Next, in evaluating the regularity, the CPU 101 executes, for example, as follows.

Initially, the CPU 101 calculates the below-mentioned topological structural evaluation value and physical structural evaluation value before the compaction (before the determination of a concrete coordinate value).

(1) Calculation of Topological Structural Evaluation Value (a) A value is calculated from the number of blocks constituting an array topological structure and the ratio (aspect) of the number of lines to the number of columns of each topology so that the aspect increases in proportion to the number of arrays which is close to 1 in aspect.

(b) A value is calculated from the number of blocks constituting row topology and the aspect so that the aspect increases in proportion to the number of rows which is close to 1 in aspect.

(c) A value is calculated so as to be proportional to the number of blocks constituting symmetrical topology other than self-symmetry (symmetry to itself)

The total value of the aforementioned values [(a)+(b)+(c)] is defined as a topological structural evaluation value.

(2) Calculation of Physical Structural Evaluation Value (Step S904)

(d) Calculation of local compactness value

As to the block of the aforementioned Item (1), "the total of each block area/the minimum rectangular area surrounding each block" is obtained as a local compactness value. With this, the compactness degree is calculated (as the larger value increases, the space increases, resulting in a higher cost.)

(e) Calculation of local uniformity value

The difference between a maximum block width and a minimum block width at each stage is added over all stages and numerically converted for evaluation to obtain a local uniformity value.

Here, if the total of the difference of the maximum block width and the minimum block width of blocks is larger with respect to the plurality columns of the aforementioned item (1), the uniformity deteriorates, resulting in a higher cost.

The value of [(d)+(e)] is defined as a physical structural evaluation value.

Next, the CPU 101 calculates the wire length and area, which are cost elements (Step S905).

Then, the CPU 101 discriminates whether the solution X' created at the processing step S902 meets the constraints. If the solution X meets the constraints, the cost comparison between the solution X' and the solution X is performed, and the more appropriate solution is selected (Step S906).

The cost and constraints used here are as follows.

(A) Constraints

Constraints are conditions to be always kept. As such constraints, adjacency constraints of blocks, symmetry constraints specified by concrete block names, and constraints considering effects of, e.g., parasitic components (e.g., resistance, capacitance) can be exemplified. These constraints are checked prior to or after the compaction for obtaining a concrete coordinate value to discriminate whether it is an allowable solution.

(B) Costs of a Topological Structural Evaluation Value and a Physical Structural Evaluation Value Prior to Compaction These are costs based on the structural evaluation value calculated at the processing steps S903 and S904. These costs can be applied to blocks other than blocks clearly specified by the constraints of the aforementioned item (A). That is, this cost is automatically calculated even in the case of not being specified from outside as constraints.

(C) Costs, such as, e.g., Area and Wire Length, After Compaction

These are costs to be evaluated after the determination of a real coordinate value of a common block, and the target is to minimize the area and the wire length (including the total wire length and specific wire length).

The CPU 101 executes optimization of the layout so as to optimize (e.g., minimize) the aforementioned costs (B) and (C) while keeping the constraints of the aforementioned (A).

That is, at the processing step S906, the CPU 101 discriminates whether the new solution X' satisfies the constraints and the cost of the new solution X' is smaller than the cost of the solution X by executing cost comparison between the new solution X' and the solution X.

When the CPU 101 discriminates that the new solution X' satisfies the constraints and the cost of the new solution X' is smaller than the cost of the solution X, the CPU 101 updates the solution from the solution X to the solution X' (Step S907) and then discriminates whether the termination conditions of the placement improvement are satisfied (Step S908).

The termination conditions of the placement improvement are, for example, a certain temperature (e.g., from 100° to 0°) when the optimization method is a SA (Simulated Annealing) method, and a generation number when the optimization method is a genetic algorithm (GA) method.

On the other hand, in cases where the CPU 101 discriminates that the new solution X' does not satisfy the constraints or the solution X' is not smaller than the solution X in cost at the processing step S906, the routine immediately proceeds to the processing step S908.

When the CPU 101 discriminates that the termination conditions of the placement improvement are not satisfied at the processing step S908, returning to the processing step S902, the CPU 101 repeats the processing. When the CPU 101 discriminates that the termination conditions of the placement improvement are satisfied, the CPU 101 makes the magnetic disk storage 104 store the obtained data of the integrated circuit layout and output the data to the display unit 103 or an external apparatus (Step S805).

Thus, by adjusting the multiple constraints and costs of the aforementioned items (A), (B) and (C) in the optimization algorithm, a layout result considering the regularity of the aforementioned item (B) in addition to the aforementioned items (A) and (C) used in a conventional integrated circuit design apparatus can be obtained.

An example of the optimization processing executed as mentioned above will be explained with reference to FIGS. 12 to 14.

FIG. 12 shows an original state (initial state) in which a plurality of blocks a-d are placed. The initial state shown in FIG. 12 is an initial state in which a plurality of blocks a-d are placed, and the number of array structures (array number) is 0 (zero) and the total physical wire length is 2.5. The arrowed line denotes physical hard-wiring and the total of these lines is a total wire length. The target of the optimization processing in this example is minimization of an array cost (i.e., maximization of the number of arrays) and minimization of the cost which is a total physical wire length.

FIG. 13 shows a state in which an array structure is created by topology optimization. In this example, the array number is 1 (one), and the total wire length is 4. The total wire length is not always optimized here.

FIG. 14 shows a state changed from the state shown in FIG. 13, and shows that the physical cost is optimized under the constraints that the cost of topology does not deteriorate. In this example, the array number is 1 and the total wire length is 2. The maximization of the array number and the minimization of the cost of the physical total wire length have been attained.

Thus, by adjusting the multiple constraints and costs of the aforementioned items (A), (B) and (C) in the optimization algorithm, a layout result considering the regularity of the aforementioned item (B) can be obtained. In other words, in performing cost calculation, by executing the processing so as to amend the cost from the viewpoint of the regularity, the cost can be further reduced in the case of a layout having higher regularity.

As explained above, the integrated circuit design apparatus according to the embodiment of the present invention extracts the regular structure in a layout from layout topological expression, evaluates the extracted layout regular structure as a layout optimization index, and executes optimization of the topological structure and the physical structure (costs of area, wire length, etc.) at the time of executing layout optimization.

That is, the CPU 101 extracts a layout regular structure in a layout using layout graphic information, net list information and constraint information with reference to regular structure information stored in the regular structure information storage 107 of the magnetic disk storage 104, evaluates the regular structure, and obtains an optimized integral circuit layout using design information, such as, e.g., the layout graphic information and the net list information, in consideration of the evaluation.

Accordingly, by obtaining a more regularly arranged layout, it becomes possible to obtain a layout result excellent in circuit characteristics, short in total wire length and excellent in wiring characteristics.

Furthermore, in layout optimization processing, by newly incorporating a regularity index, a layout result automatically considers the regular structure, such as, e.g., an array-structure, a row-structure, or a slice-structure, even if there is no explicit constraint, such as, e.g., alignment. In addition to the above, by combining conventional costs of area and wire length and additional constraints, such as, e.g., pair nature or symmetry nature, to perform an automatic layout, it becomes possible to obtain a regularly arranged good-looking layout preferred by analog designers.

Furthermore, by internally considering the regularity without specifying explicit regulations from outside, an automatic layout result becomes a regular layout result using a minimum additional constraint. As a result, it becomes possible to improve the yield and obtain excellent matching characteristics. Furthermore, since circuit elements can be connected with short and simple wiring, the wiring characteristics (e.g., each circuit element can be easily connected with appropriate wiring) can be improved, and the layout design efficiency can be improved.

The concept of the present invention can be applied not only to design of analog semiconductor integrated circuits but also to design of digital semiconductor integrated circuits. Especially, in analog semiconductor integrated circuits, an excellent layout result can be obtained.

Furthermore, by making a computer execute the integrated circuit design program according to an embodiment of the present invention, it becomes possible to establish the integrated circuit design apparatus using a computer.

In the case of calculating an evaluation value by performing an evaluation of a topological regular structure, it can be configured to calculate the evaluation value by evaluating at least one of an array-structure, a row-structure, a slice-structure, a room-structure, and an object-structure.

Furthermore, in the case of calculating an evaluation value by evaluating the physical regular structure, it can be configured to calculate the evaluation value by evaluating at least one of the local compactness value and a local uniformity value.

The present invention can be applied to an integrated circuit design apparatus and a method for designing analog semiconductor integrated circuits or digital semiconductor integrated circuits. Furthermore, it can be applied to a program for causing a computer to function as an integrated circuit design apparatus for designing analog semiconductor integrated circuits or digital semiconductor integrated circuits.

While the present invention may be embodied in many different forms, a number of illustrative embodiments are described herein with the understanding that the present disclosure is to be considered as providing examples of the principles of the invention and such examples are not intended to limit the invention to preferred embodiments described herein and/or illustrated herein.

While illustrative embodiments of the invention have been described herein, the present invention is not limited to the various preferred embodiments described herein, but includes any and all embodiments having equivalent elements, modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." In this disclosure and during the prosecution of this application, means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited. In this disclosure and during the prosecution of this application, the terminology "present invention" or "invention" is meant as a non-specific, general reference and may be used as a reference to one or more aspect within the present disclosure. The language present invention or invention should not be improperly interpreted as an identification of criticality, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof, and/or any portion thereof, etc. In some examples, various embodiments may include overlapping features. In this disclosure and during the prosecution of this case, the following abbreviated terminology may be employed: "e.g." which means "for example;" and "NB" which means "note well."

What is claimed is:

1. An integrated circuit design apparatus, comprising:
a storing unit configured to store design information required for designing an integrated circuit comprises an information representing regular structures found in a layout as a certain rule, a layout graphic information, a net list information, a constraint information and a cost information;
an evaluation unit configured to extract a topological regular structure represented by an alignment relation of devices or of a pair of blocks in right and left or up and down directions in the layout including at least one of an array-structure, a row-structure, a slice-structure, a room-structure, and an object, by using the layout graphic information, the net list information and the constraint information with reference to the information representing the layout, and to evaluate the information representing a degree of the regularity of the layout based on the topological regular structures and physical regular structures; and
an optimization unit configured to optimize the layout of the integrated circuit based on the design information,
wherein the evaluation unit performs an evaluation based on at least one of the regular structures when performing the evaluation of the information representing the layout of the regular structures which is based on the topological regular structure represented by the alignment relation of devices or of the pair of blocks in right and left or up and down directions in the layout, and
wherein the optimization unit optimizes the layout of the integrated circuit using the layout graphic information, the net list information, and the cost information while satisfying constraints contained in the constraint information and considering the evaluation of the information representing the layout of the regular structures by the evaluation unit.

2. The integrated circuit design apparatus as recited in claim 1, wherein the evaluation unit performs the extraction of the topological regular structure by using a Bounded-Sliceline Grid method, a Sequence-Pair method, an O-Tree method, a B*-Tree method or a TCG-S method.

3. The integrated circuit design apparatus as recited in claim 1, wherein the evaluation unit performs the evaluation based on a local compactness value and a local uniformity value when performing an evaluation of the information representing the layout of the regular structures that are represented by the certain rule based on the topological regular structure.

4. The integrated circuit design apparatus as recited in claim 2, wherein the evaluation unit performs the evaluation based on a local compactness value and a local uniformity value when performing an evaluation of the information representing the layout of the regular structures based on the topological regular structure.

5. A computer readable medium having computer program recorded thereon, which when executed by a computer for optimizing a layout of an integrated circuit, implements:
storing means for storing design information required for designing an integrated circuit comprises an information representing regular structures found in a layout as a certain rule, a layout graphic information, a net list information, a constraint information and a cost information;
evaluation means for extracting a topological regular structure represented by an alignment relation of devices or of a pair of blocks in right and left or up and down directions in the layout including at least one of an array-structure, a row-structure, a slice-structure, a room-structure, and an object, by using the layout graphic information, the net list information and the constraint information with reference to the information representing the layout, and to evaluate the information representing a degree of the regularity of the layout based on the topological regular structures and physical regular structures; and
optimization means for optimizing the layout of the integrated circuit based on the design information,
wherein the evaluation means performs an evaluation based on at least one of the regular structures when performing the evaluation of the information representing the layout of the regular structures which is based on the topological regular structure represented by the alignment relation of devices or of the pair of blocks in right and left or up and down directions in the layout, and
wherein the optimization means optimizes the layout of the integrated circuit using the layout graphic information, the net list information, and the cost information while satisfying constraints contained in the constraint information and considering the evaluation of the information representing the layout of the regular structures by the evaluation means.

6. The computer readable medium as recited in claim 5, wherein the evaluation means performs an evaluation based on a local compactness value and a local uniformity value when performing an evaluation of the regular structures that are represented by the certain rule based on the topological regular structure.

7. A method of designing an integrated circuit, the method comprising the steps of:

storing design information required for designing an integrated circuit comprises an information representing regular structures found in a layout as a certain rule, a layout graphic information, a net list information, a constraint information and a cost information;

extracting, using a microprocessor, a topological regular structure represented by an alignment relation of devices or of a pair of blocks in right and left or up and down directions in the layout including at least one of an array-structure, a row-structure, a slice-structure, a room-structure, and an object, by using the layout graphic information, the net list information and the constraint information with reference to the information representing the layout, and to evaluate the information representing a degree of the regularity of the layout based on the topological regular structures and physical regular structures; and optimizing the layout of the integrated circuit based on the design information, wherein an evaluation based on at least one of the regular structures when performing the evaluation of the information representing the layout of the regular structures which is based on the topological regular structure represented by the alignment relation of devices or of the pair of blocks in right and left or up and down directions in the layout, and wherein optimizing the layout of the integrated circuit using the layout graphic information, the net list information, and the cost information while satisfying constraints contained in the constraint information and considering the evaluation of the information representing the layout of the regular structures by the evaluation.

8. The method of designing an integrated circuit as recited in claim 7, wherein the evaluation is performed based on a local compactness value and a local uniformity value when performing the evaluation of the regular structures that are represented by the certain rule based on the topological regular structure.

* * * * *